United States Patent [19]
Goto et al.

[11] Patent Number: 5,140,346
[45] Date of Patent: Aug. 18, 1992

[54] IMAGE FORMING APPARATUS

[75] Inventors: Takashi Goto, Zushi; Koji Kato, Tokyo, both of Japan

[73] Assignee: Canon Kabushiki Kaisha, Tokyo, Japan

[21] Appl. No.: 530,278

[22] Filed: May 30, 1990

[30] Foreign Application Priority Data

Jun. 2, 1989 [JP] Japan .................................. 1-140789

[51] Int. Cl.$^5$ .............................................. H05K 5/00
[52] U.S. Cl. ................................... 346/145; 361/391; 361/413; 361/415
[58] Field of Search ............... 346/145; 364/708; 355/210, 211; 361/391, 413, 415, 395, 399

[56] References Cited

U.S. PATENT DOCUMENTS

| | | | |
|---|---|---|---|
| 4,359,746 | 11/1982 | Goldschmidt et al. | 346/33 R |
| 4,641,980 | 2/1987 | Matsumoto et al. | 400/120 |
| 4,778,291 | 10/1988 | Mitsuhashi | 400/121 |
| 4,840,568 | 6/1989 | Burroughs et al. | 439/49 |
| 4,872,212 | 10/1989 | Roos et al. | 361/424 |
| 4,894,753 | 1/1990 | Wadell et al. | 361/424 |

Primary Examiner—Joseph W. Hartary
Assistant Examiner—Victor DeVito
Attorney, Agent, or Firm—Fitzpatrick, Cella, Harper & Scinto

[57] ABSTRACT

A processing function substrate for page layout and the like, and a display unit, an operation unit and the like are provided on an identical substrate or as an identical unit, and the unified substrate or unit is mounted on a main body by a sliding-in operation. Hence, it becomes possible to realize improvement in assembling capability, improvement in properties against radiation noises, electrostatic noises and the like due to the adoption of one unit, improvement in designing capability, reduction in cost, and the like.

15 Claims, 5 Drawing Sheets

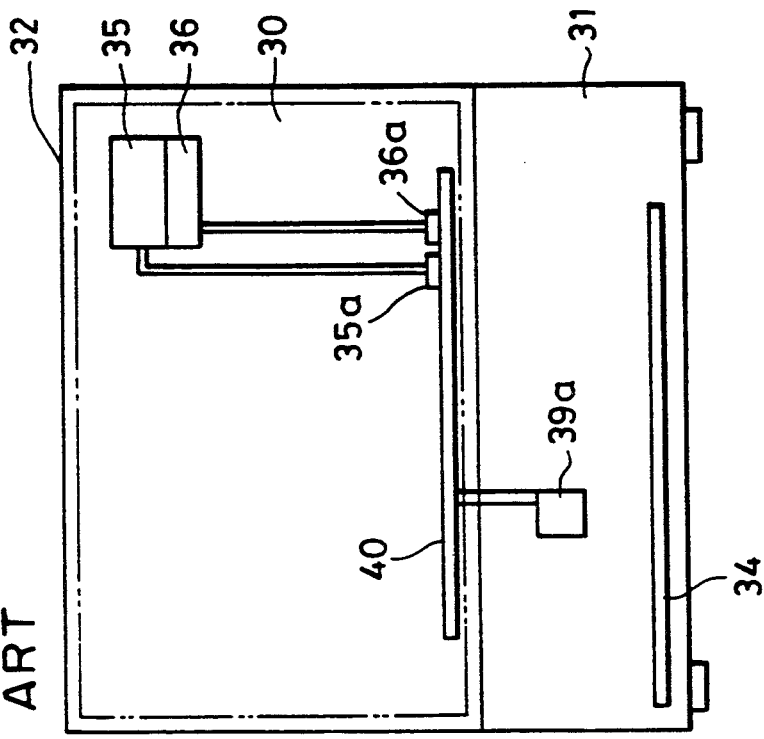
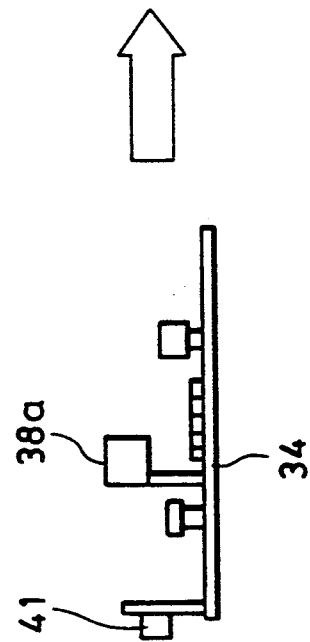
FIG. 8
PRIOR ART

IMAGE FORMING APPARATUS

BACKGROUND OF THE INVENTION

1. Field of the Invention

This invention relates to an image forming apparatus, such as a printer, a facsimile or the like, and more particularly, to an image forming apparatus for displaying data output from a computer.

2. Description of the Prior Art

Image forming apparatus suitable for displaying data output from a computer generally have additional functions added at a circulation stage in order to output data from the computer in accordance with given objectives. This is realized by mounting on the main body of the printer a print processing unit which contains circuitry to perform functions, such as the generation of high-precision images, the selection of a typeface for output data, the increase in processing speed of output, and the like.

A conventional image forming apparatus of this kind generally has a configuration as shown in FIG. 6.

Printer engine unit 30 is contained within the printer main body unit 32, and a print processing substrate board mounting unit 31 for page layout and the like is mounted closer to the user. A display unit 35 is provided at an upper portion of the printer main body unit 32. An operation unit 36 is provided adjacent to the display unit 35. The display unit 35 and the operation unit 36 are connected to a printer control substrate board 40 by connectors 35a and 36a, respectively. A print processing function substrate board 34 in the mounting unit 31 is connected to a connector 39 of the printer control substrate board 40 by a connector 38.

To mount the print processing function substrate board 34, the printer main body unit 32 is placed on a table upside down, the case 33 of the print processing substrate board mounting unit 31 is opened, and the print processing function substrate board 34 is mounted by screwing or the like, as shown in FIG. 7. Subsequently, the connector 38 of the print processing function substrate board 34 is connected to the connector 39 of the printer control substrate board 40. At this time, the display unit 35 and the operation unit 36 must be newly mounted or replaced in accordance with the contents of the substrate 34 thus mounted. In any case, the respective connectors 35a and 36a of the display unit 35 and the operation unit 36 must be connected to the printer control substrate 40.

In this method, even if the display unit 35 and the operation unit 36 are mounted on the case 33 of the mounting unit 31, there is still the problem of the respective connectors 35a and 36a of the display 35 and the operation unit 36 being connected to the printer control substrate 40. Accordingly, the display unit 35 and the operation unit 36 are provided at an upper portion of the main body unit 32 which provides a little better operationability than the mounting unit 31.

The print processing function substrate board 34 may also be mounted as shown in FIG. 8 by sliding the print processing substrate board 34 into the mounting unit 31 from its rear portion. Connector 38a is connected to a connector 39a, and the substrate board 34 is thus connected to the printer control substrate board 40. Even in this method, the display unit 35 and the operation unit 36 must be newly mounted or replaced in accordance with the contents of the substrate board 34 thus mounted, and the respective connectors 35a and 36a of the display unit 35 and the operation unit 36 must be connected to the printer control substrate board 40. Although this method does not necessitate reopening the case 33 of the mounting unit 31, as in the method depicted in FIG. 6, it has the added problem of low strength of the substrate board 34 because this method merely positions the print processing function substrate board 34 in the mounting unit 31 by sliding the substrate board 34. As a result, when connecting and disconnecting to the external interface connector 41, the exerted force is directly applied to the substrate board 34. This results in an inferior operability in the connecting and disconnecting operation for the connector 41, and also may adversely influence the connection between the connectors 38a and 39a.

In this method, if one intends mounting the display unit 35 and the operation unit 36 on the case 33 of the mounting unit 31, the respective connectors 35a and 36a of the display unit 35 and the operation unit 36 must be connected to the substrate board 40, in addition to the connection between the connectors 38a and 39a, when the substrate board 34 is slid into position. This is very difficult to realize. Accordingly, the display unit 35 and the operation unit 36 are not mounted on the case 33 of the mounting unit 31, but are provided on an upper portion of the printer main body unit 32.

In the prior art described above, the case 33 of the mounting unit 31, once closed, must be reopened. When a substrate having an I/F connector is slid into the printer from its rear portion, the display unit 35 indicating the processing state for the user of the printer and the key operation unit 36 must be mounted separately from the slidein mounting of the substrate. Moreover, the respective connectors 35a and 36a of the display unit 35 and the operation unit 36 must be connected to the printer control substrate board 40. Accordingly, even the mere addition of a print processing substrate board to an image forming apparatus, supporting additional functions, requires much time and cannot easily be performed.

SUMMARY OF THE INVENTION

It is an object of the present invention to solve the disadvantages as described above by a method capable of easily adding additional functions to an image forming apparatus.

It is another object of the present invention to provide a display unit and an operation unit on an identical substrate unit, which is firmly mounted on a main body by being slid into it.

According to one aspect of the invention there is provided an image forming apparatus which comprises a printed main body unit, a mounting unit, a print processing unit and a connection means. The printer main body unit includes a printer engine unit and also has a printer control substrate board provided therein. The mounting unit is fixed to the printer main body unit. In addition, the mounting unit has a pair of facing walls, each containing a through-opening. The print processing unit is slideably engageable with the mounting unit through one of the through-openings. The print processing unit also includes a print processing substrate board, a first member which forms a side wall in one of the through-openings and a second member which forms a side wall in the other through-opening. The connection means connects the print processing unit to the mounting unit.

According to another aspect of the invention there is provided an image forming apparatus which comprises a printer main body unit, a mounting unit, a print processing unit, a sliding means on the mounting unit a connection means. The printer main body unit has a printer engine unit and a printer control substrate board provided therein. The mounting unit is fixed to the printer main body unit. The mounting unit also has a pair of facing side walls, each containing a through-opening. The print processing unit includes a print processing substrate board. Also, the print processing unit is slideably engageable with the mounting unit and forms a box-like shape when so engaged with the mounting unit. The print processing unit further includes a key operation unit and a display unit which conform to the print processing substrate board. The sliding means on the mounting unit is arranged to permit sliding of the print processing unit into the mounting unit. The connection means serves to connect the print processing unit to the mounting unit.

According to a further aspect of the invention there is provided an image forming apparatus which comprises a printer main body unit, a mounting unit, a print processing unit and first and second connection means. The printer main body unit is provided with a printer engine unit and a printer control substrate board.

The mounting unit is fixed to the printer main body unit. The mounting unit also has a pair of walls facing one another; each wall contains a through-opening. The print processing unit includes a print processing substrate board. The print processing unit also provides a first member which is used as a slide wall for one of the pair of mounting unit walls and a second member which is used as a side wall for the other of the pair of mounting unit walls. The first member also includes an external interface connector; and the second member includes a display unit and an operation unit. The first connection means serves to connect the print processing unit to the mounting unit; and the second connection means serves to connect the printer control substrate board to the print processing substrates board when said print processing unit is slid into the mounting unit.

These and other objects of the present invention will become more apparent from the following detailed description of the preferred embodiments.

BRIEF DESCRIPTION OF THE DRAWINGS

FIG. 8 is a diagram showing another example of the mounting method of the substrate shown in FIG. 6.

DESCRIPTION OF THE PREFERRED EMBODIMENTS

An embodiment of the present invention will now be explained with reference to the drawings.

Figure 1:
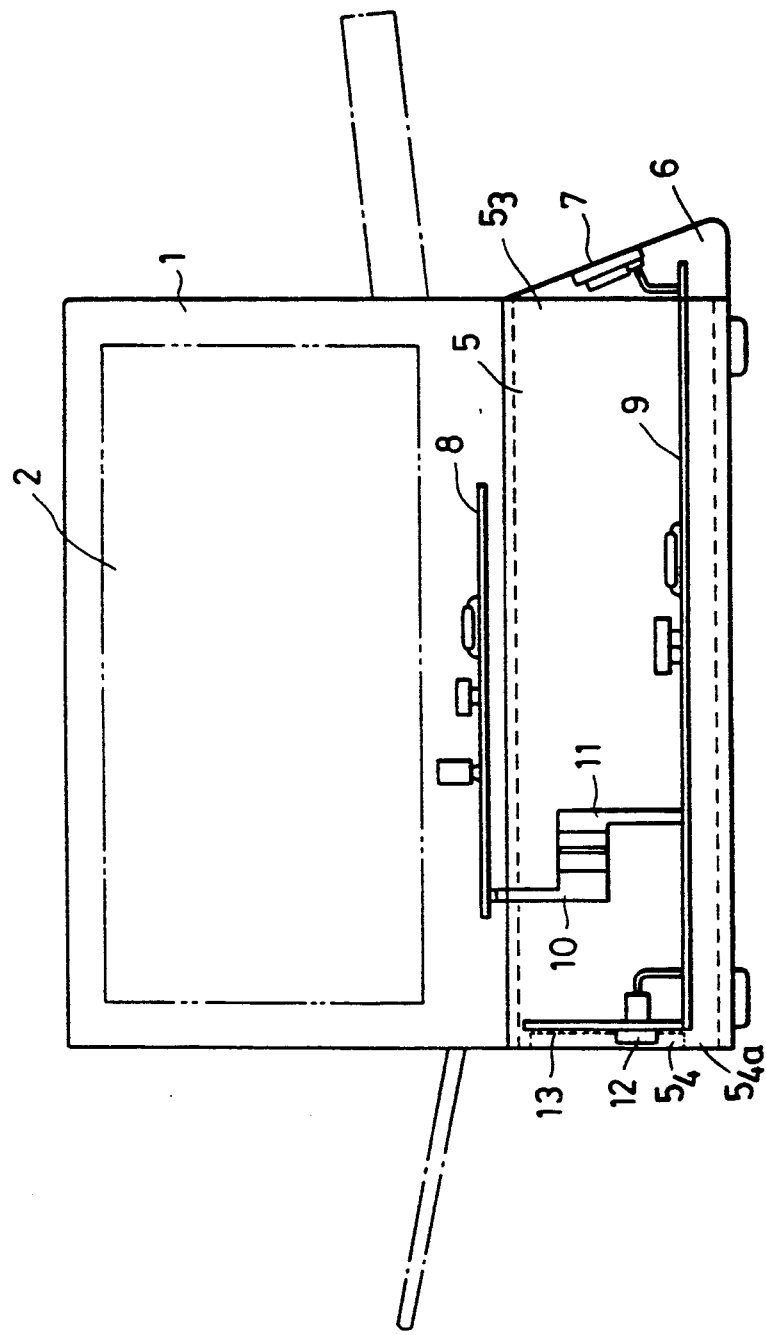
FIG. 1 is a front view of an image forming apparatus according to an embodiment of the present invention.
Figure 2:
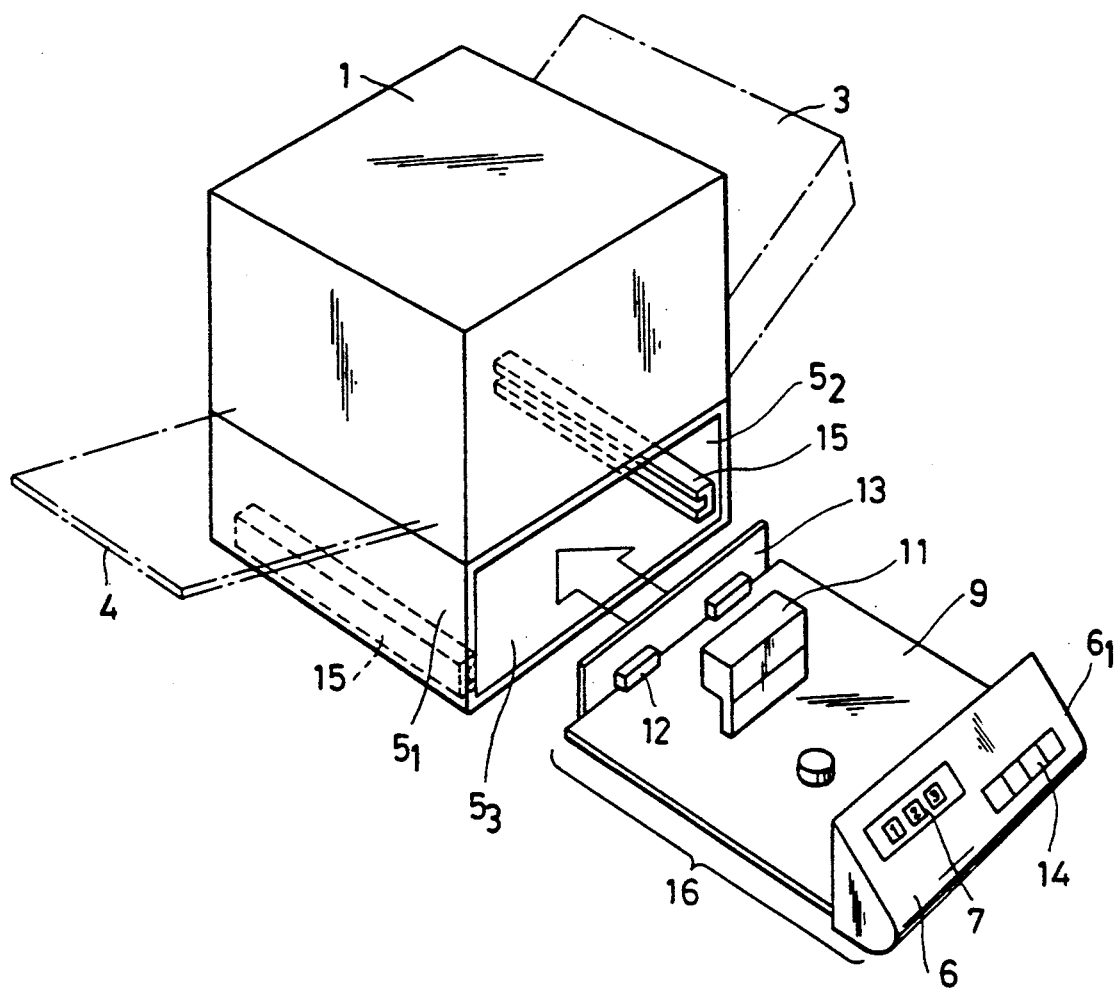
FIG. 2 is a perspective view of the apparatus shown in FIG. 1 when a substrate is slid into it.

FIGS. 1 and 2 show a printer main body unit 1, a printer engine unit (printing unit) 2, a cassette 3 for paper, a paper discharge tray 4, a mounting unit 5, a display operation unit 6, a display unit 7, a printer control substrate board 8, a printer processing substrate board 9, a first connector 10, a second connector 11, an external interface connector 12, a connector mounting plate 13, a key operation unit 14, rails 15, and a print processing unit 16.

The printer consists of the printer main body unit 1 and the mounting unit 5. A print processing substrate board such as a page layout function substrate board, and the like is mounted within the mounting unit 5. Paper is supplied from the cassette 3 into the printer main body unit 1, printing is performed by the printer engine unit 2, and the printed paper is discharged onto the paper discharge tray 4. The display unit 7 and the key operation unit 14 are provided in conjunction with the contents of the print processing substrate board 9.

In the printer main body unit 1, the printer control substrate board 8 is incorporated, which controls an engine mechanism and the like.

The mounting unit 5 forms a box-like case, within which the rails 15 are disposed. The rails 15 are provided on the inner surfaces of a pair of side walls $5_1$ and $5_2$ facing each other. The other part of side walls $5_3$ and $5_4$ are facing each other. Side $5_3$ the mounting unit 5 is completely opened, and the side $5_4$ which faces side $5_3$ is opened except for its circumference $5_{4a}$.

The print processing unit 16 is configured as one unit by providing the print processing substrate board 9 having the second connector 11 at its center, mounting the connector mounting plate 13 at one end, and mounting the display operation unit 6 at another end.

The display operation unit 6 functions as a side wall in the opened side $5_3$ of the mounting unit 5, and provides the display unit 7 and the key operation unit 14 on its protruded surface $6_1$. The connector mounting plate 13 functions as a side wall in the other opened side $5_4$ of the mounting unit 5, and provides the external interface connector 12. Both sides of the print processing substrate board 9 can be slid on the rails 15.

Next, an explanation will be provided of a case in which the print processing unit 16 thus configured is mounted in the mounting unit 5.

Figure 3:
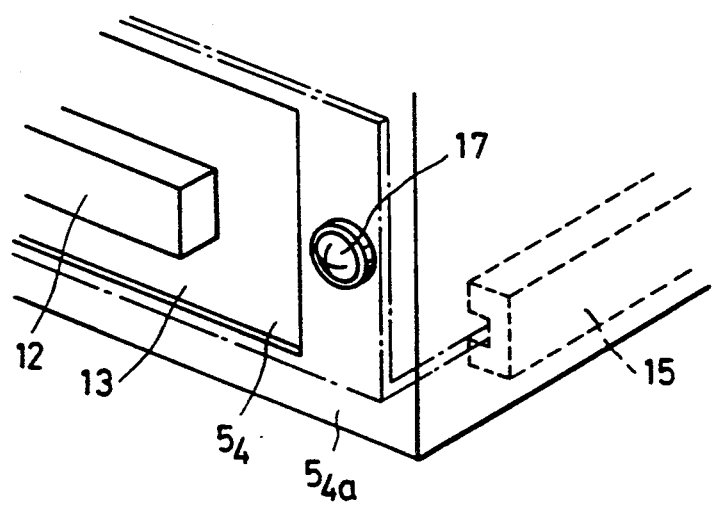
FIG. 3 is a rearward view of a print processing substrate unit shown in FIG. 2 inserted in a print processing substrate mounting unit.

Both sides of the print processing substrate board 9 are inserted into the slots of rails 15, beginning at the end of substrate board 9, with the mounting plate 13. The print processing unit 16 is then slid along the rails 15 in the direction of the arrow. When the display operation unit 6 contacts the circumferential portion of the opened side $5_3$, the mounting plate 13 contacts the circumference $5_{4a}$ of the opened side wall $5_4$, as shown in FIG. 3. The external interface connector 12 is thereby exposed from the opened side $5_4$.

Once the print processing unit 16 has been slid along the rails 15 completely into the mounting unit 5, the second connector 11 is connected to the first connector 10, and the printer main body unit 1 and the print processing unit 16 are thereby electrically connected to each other to operate in unison. This constitutes one embodiment of second connection means. After the connection between the first connector 10 and the second connector 11 has been confirmed, and the print processing unit 16 has completely been slid into the mounting unit 5 along the rails 15, the print processing unit 16 is fixed to the print processing substrate mounting unit 5 by screwing right and left sides of the mounting plate 13 with screws 17, as shown in FIG. 3. The screws 17 and mounting plate 13 constitute connection means for connecting said print processing unit to said mounting unit.

The print processing unit 16 thus forms a rigid box-like shape together with the mounting unit 5. Hence, even if the external interface connector 12 is used, the force applied while connecting to connector 12 is dispersed over the entire mounting unit 5, causing remarkable improvement in the operationability of the external interface connector 12.

Figure 4:
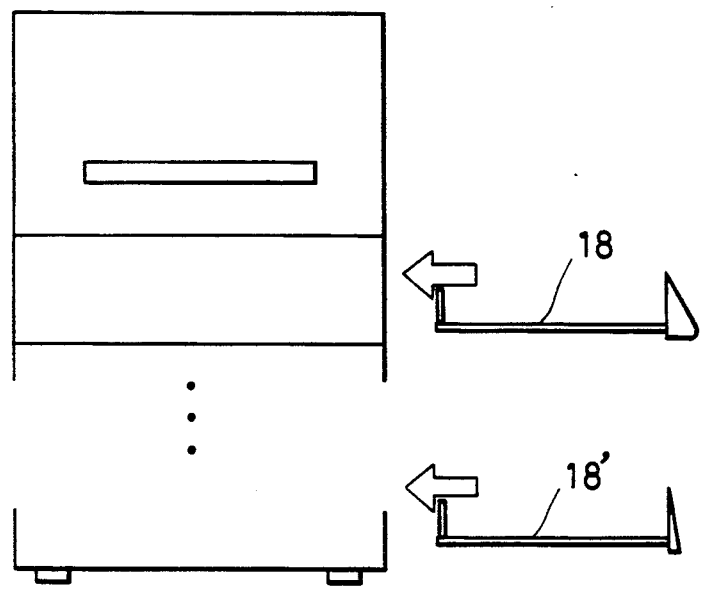
FIG. 4 is a diagram showing a first modified embodiment of the apparatus shown in FIG. 1.

FIG. 4 shows a first modified example of the apparatus shown in FIG. 1. In this first modified example, substrate units 18 and 18' are stacked in multiple stages.

Figure 5:
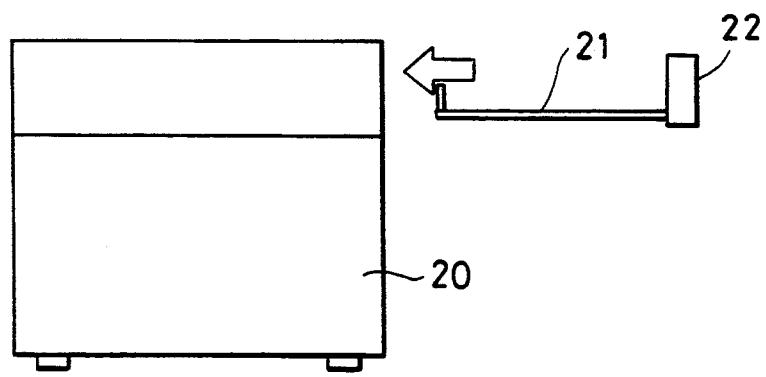
FIG. 5 is a diagram showing a second modified embodiment of the apparatus shown in FIG. 1.
Figure 6:
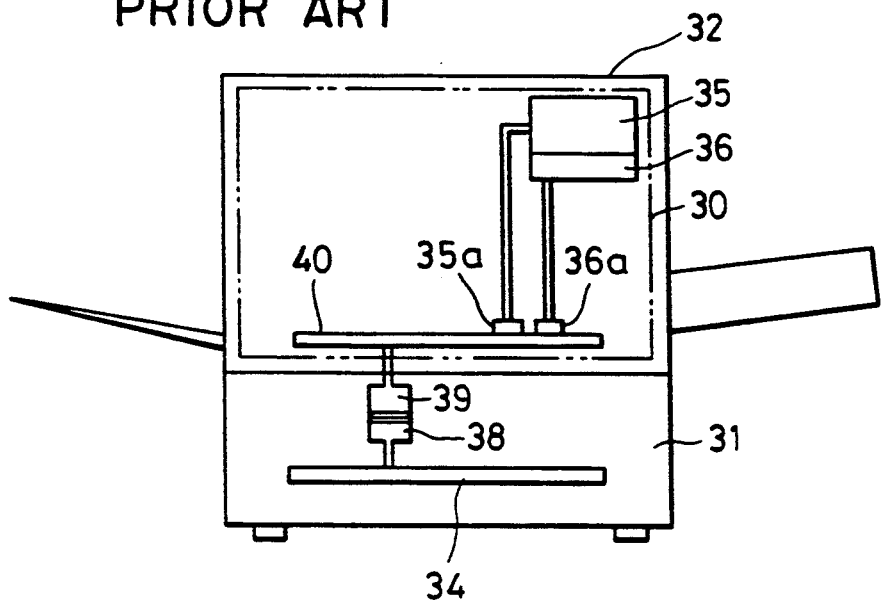
FIG. 6 is a front view showing a conventional image forming apparatus.
Figure 7:
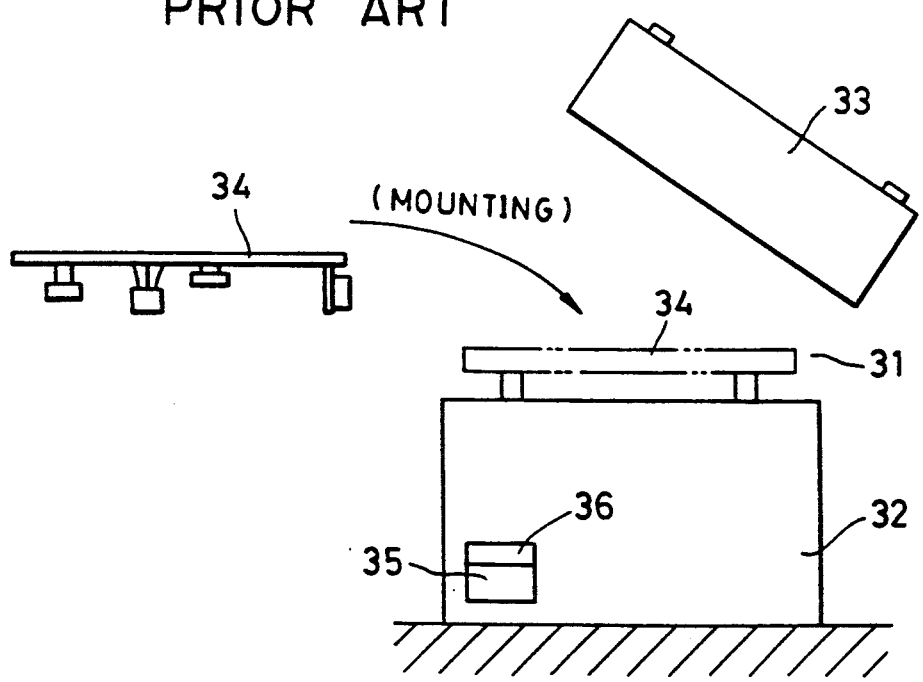
FIG. 7 is a diagram showing an example of the mounting method of a substrate shown in FIG. 6.

FIG. 5 shows a second modified example of the apparatus shown in FIG. 1. This second modified example shows an embodiment where a print processing unit 21 mounting a display operation unit 22 is mounted on an upper portion of a printer main body unit 20.

The present invention may be applied not only to the design shown in FIGS. 1 and 2, but also to all kinds of designs. Furthermore, the connection between the substrates may be performed during the sliding-in operation of the print processing unit not only by the connectors 10 and 11 shown in FIGS. 1 and 2, but also using harnesses. Moreover, the same configuration may be adopted not only for printers, but also for other apparatuses which require a similar processing unit, for example, facsimiles, typewriters or the like. In addition, the sliding direction is not limited to the direction shown in the above-described embodiments, but the processing substrate unit may also be slid from the side of the I/F connector.

As described above, according to the present invention, a simple configuration is provided in which the processing function for enhancements such as page layout and the like, and the display and operation unit are provided on an identical substrate board or as an identical unit, and the unified substrate board or unit is mounted on the main body by a sliding-in operation. Hence, the present invention makes possible improvements in assembling capability, improvements in properties reducing radiation noises, electrostatic noises and the like due to the adoption of one unit, improvements in designing capability, and improvements in cost reduction.

What is claimed is:

1. An image forming apparatus comprising:
    a printer main body unit with a printer engine unit and a printer control substrate board provided therein;
    a mounting unit fixed to said printer main body unit, said mounting unit having a pair of facing walls, each containing through-openings;
    a print processing unit slideably engageable with said mounting unit through one of said through-openings, said print processing unit including a print processing substrate board, a first member forming a side wall in one of said through-openings and a second member forming a side wall in the other of said through-openings, said second member being electrically connected with said printer control substrate board through said print processing substrate board, and having an input/output unit for receiving data from and outputting data to said printer main body unit;
    connection means for electrically connecting said printer control substrate board to said print processing substrate board, said connection means having a first connector being electrically connected to said printer control substrate board and a second connector being electrically connected to said print processing substrate board, said first connector being disposed in said mounting unit, wherein said second connector is connected to said first connector when said print processing unit is slid into said mounting unit; and
    coupling means for coupling said print processing unit to said mounting unit.

2. An image forming apparatus according to claim 1, wherein said coupling means comprises screws for coupling said first member to a circumference of one of said through-openings.

3. An image forming apparatus according to claim 1, wherein said print processing unit forms a box-like shape when slideably engaged with said mounting unit.

4. An image forming apparatus according to claim 1, wherein said mounting unit includes a second pair of facing side walls, each substantially perpendicular to the first pair, within which rails are provided for sliding said print processing unit therein.

5. An image forming apparatus according to claim 1, wherein said input/output unit includes a display unit.

6. An image forming apparatus according to claim 1, wherein said input/output unit includes an operation unit.

7. An image forming apparatus according to claim 1, wherein said first member includes an external interface connector.

8. An image forming apparatus according to claim 1, wherein said printer main body unit includes a lower side and an upper side and said mounting unit is provided adjacent the lower side of said printer main body unit.

9. An image forming apparatus according to claim 1, wherein said printer main body unit includes a lower side and an upper side and said mounting unit is provided adjacent the upper side of said printer main body unit.

10. An image forming apparatus according to claim 1, wherein a plurality of mounting units are provided, and wherein a plurality of print processing units are provided.

11. An image forming apparatus comprising:
    a printer main body unit including a printer engine and a printer control substrate board for controlling said printer engine in collaboration with a print processing substrate board;
    a mounting unit provided adjacent said printer main body unit, said mounting unit having a through-opening;
    a print processing unit slideably engageable with said mounting unit through said through-opening, said print processing unit including said print processing substrate board and a member forming a side wall of said through-opening and being electrically connected with said printer control substrate board through said print processing substrate board for receiving data from and outputting data to said printer main body unit; and connection means for electrically connecting said printer control substrate board to said print processing substrate board, said connection means having a first connector being electrically connected to said printer control substrate board and a second connector being electrically connected to said print processing substrate board, said first connector being disposed in said mounting unit, wherein said second connector is connected to said first connector when said printing processing unit is slid into said mounting unit.

12. An image forming apparatus according to claim 11, wherein said mounting unit includes rails for sliding insertion of said print processing unit.

13. An image forming apparatus according to claim 11, wherein said print processing unit includes an external interface connector.

14. An image forming apparatus according to claim 11, wherein said member includes a display unit.

15. An image forming apparatus according to claim 11, wherein said member includes an operation unit.

* * * * *